United States Patent
Baike et al.

(10) Patent No.: US 9,287,447 B2
(45) Date of Patent: Mar. 15, 2016

(54) LIGHT EMITTING ELEMENT AND LIGHT EMITTING DEVICE

(71) Applicant: NICHIA CORPORATION, Anan-shi, Tokushima (JP)

(72) Inventors: Ikuko Baike, Anan (JP); Ryo Suzuki, Anan (JP)

(73) Assignee: NICHIA CORPORATION, Anan-shi (JP)

(*) Notice: Subject to any disclaimer, the term of this patent is extended or adjusted under 35 U.S.C. 154(b) by 0 days.

(21) Appl. No.: 14/313,167

(22) Filed: Jun. 24, 2014

(65) Prior Publication Data

US 2015/0001574 A1    Jan. 1, 2015

(30) Foreign Application Priority Data

Jun. 28, 2013 (JP) .................................. 2013-137235

(51) Int. Cl.
| | |
|---|---|
| H01L 33/48 | (2010.01) |
| H01L 33/36 | (2010.01) |
| H01L 33/20 | (2010.01) |
| H01L 33/00 | (2010.01) |
| H01L 33/56 | (2010.01) |

(52) U.S. Cl.
CPC ............. *H01L 33/20* (2013.01); *H01L 33/0079* (2013.01); *H01L 33/56* (2013.01)

(58) Field of Classification Search
None
See application file for complete search history.

(56) References Cited

U.S. PATENT DOCUMENTS

| | | | |
|---|---|---|---|
| 2002/0056848 A1* | 5/2002 | Wirth | ................................ 257/98 |
| 2004/0041220 A1 | 3/2004 | Kwak et al. | |
| 2006/0091409 A1 | 5/2006 | Epler et al. | |
| 2006/0240585 A1 | 10/2006 | Epler et al. | |
| 2007/0194327 A1 | 8/2007 | Ueda et al. | |
| 2010/0041170 A1 | 2/2010 | Epler et al. | |
| 2011/0084301 A1 | 4/2011 | Epler et al. | |
| 2011/0272706 A1 | 11/2011 | Kwak et al. | |
| 2011/0297985 A1 | 12/2011 | Naka | |
| 2012/0223326 A1 | 9/2012 | Kwak et al. | |
| 2013/0193478 A1* | 8/2013 | Shinohara et al. | ............. 257/103 |
| 2013/0240931 A1 | 9/2013 | Akimoto et al. | |
| 2013/0313562 A1 | 11/2013 | Epler et al. | |

FOREIGN PATENT DOCUMENTS

| | | |
|---|---|---|
| JP | 2002-338398 A | 11/2002 |
| JP | 2006-128710 A | 5/2006 |
| JP | 2007-073734 A | 3/2007 |
| JP | 2007-235122 A | 9/2007 |
| JP | 2008-140873 A | 6/2008 |
| JP | 2011-216907 A | 10/2011 |
| JP | 2011-258658 A | 12/2011 |
| JP | 2013-197309 A | 9/2013 |

* cited by examiner

*Primary Examiner* — Robert Carpenter
(74) *Attorney, Agent, or Firm* — Global IP Counselors, LLP (57) ABSTRACT

A light emitting element has a semiconductor layer, a pair of positive and negative electrodes, and a reinforcing portion. The pair of positive and negative electrodes is disposed on a lower face side of the semiconductor layer. The pair of electrodes is connected to the substrate. The reinforcing portion is disposed on an outer edge part of an upper face of the semiconductor layer. The reinforcing portion is made from a light-transmissive material. The upper face includes an exposed portion exposed from the reinforcing portion.

17 Claims, 8 Drawing Sheets

LIGHT EMITTING ELEMENT AND LIGHT EMITTING DEVICE

CROSS-REFERENCE TO RELATED APPLICATION

This application claims priority to Japanese Patent Application No. 2013-137235, filed on Jun. 28, 2013. The entire disclosure of Japanese Patent Application No. 2013-137235 is hereby incorporated herein by reference.

BACKGROUND

1. Field of the Invention

The present discloser relates to a light emitting element and a light emitting device.

2. Background Art

Light emitting elements comprising electrodes connected to a substrate, and a semiconductor layer disposed on the electrodes were known in the past (see Japanese Laid-Open Patent Application 2006-128710, for example).

SUMMARY

A light emitting element according to the embodiments of the invention has at least a semiconductor layer, a pair of positive and negative electrodes, and a reinforcing portion. The pair of positive and negative electrodes is disposed on a lower face side of the semiconductor layer. The pair of electrodes is connected to a substrate. The reinforcing portion is disposed on an outer edge part of an upper face of the semiconductor layer. The reinforcing portion is made from a light-transmissive material. The upper face includes an exposed portion exposed from the reinforcing portion.

DETAILED DESCRIPTION

With the traditional light emitting element, a resin layer or the like is sometimes formed on the semiconductor layer in post-processing. In this case, there is the risk that pressure exerted on the semiconductor layer will damage the end of the semiconductor layer.

The embodiments of the present invention are conceived in light of the above situation, and it is an object thereof to provide a light emitting element and a light emitting device with which damage to the end of the semiconductor layer can be suppressed.

Next, embodiments of the present invention will now be described through reference to the drawings. In the description of the drawings, portions that are the same or similar will be numbered in the same or similar ways. These drawings are just schematics, however, and dimensional proportions and so forth may differ from those in actual practice. Therefore, specific dimensions and the like should be determined by referring to the description. Naturally, there are portions in which the dimensional relations and proportions vary from one drawing to the next.

Configuration of Light Emitting Element 20 and Light Emitting Device 100

Figure 1:
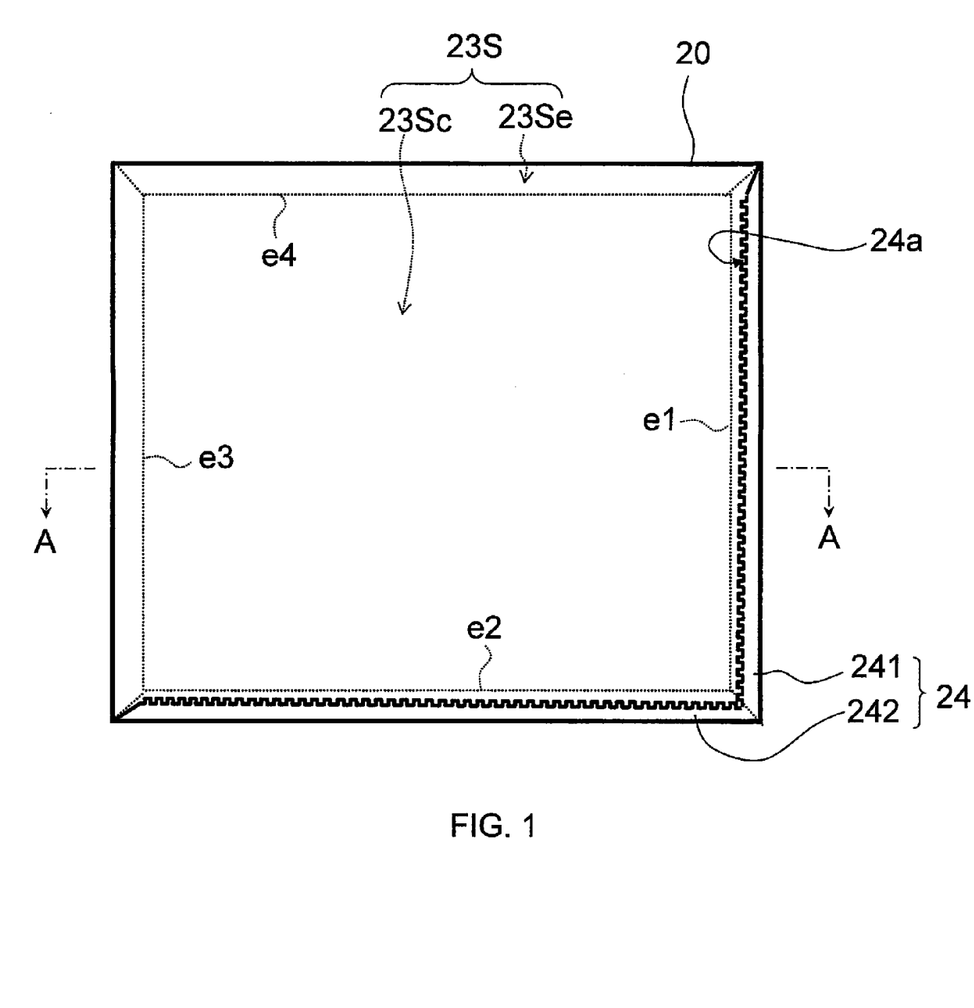
FIG. 1 is a schematic plan view of the configuration of a light emitting device according to an embodiment.
Figure 2:
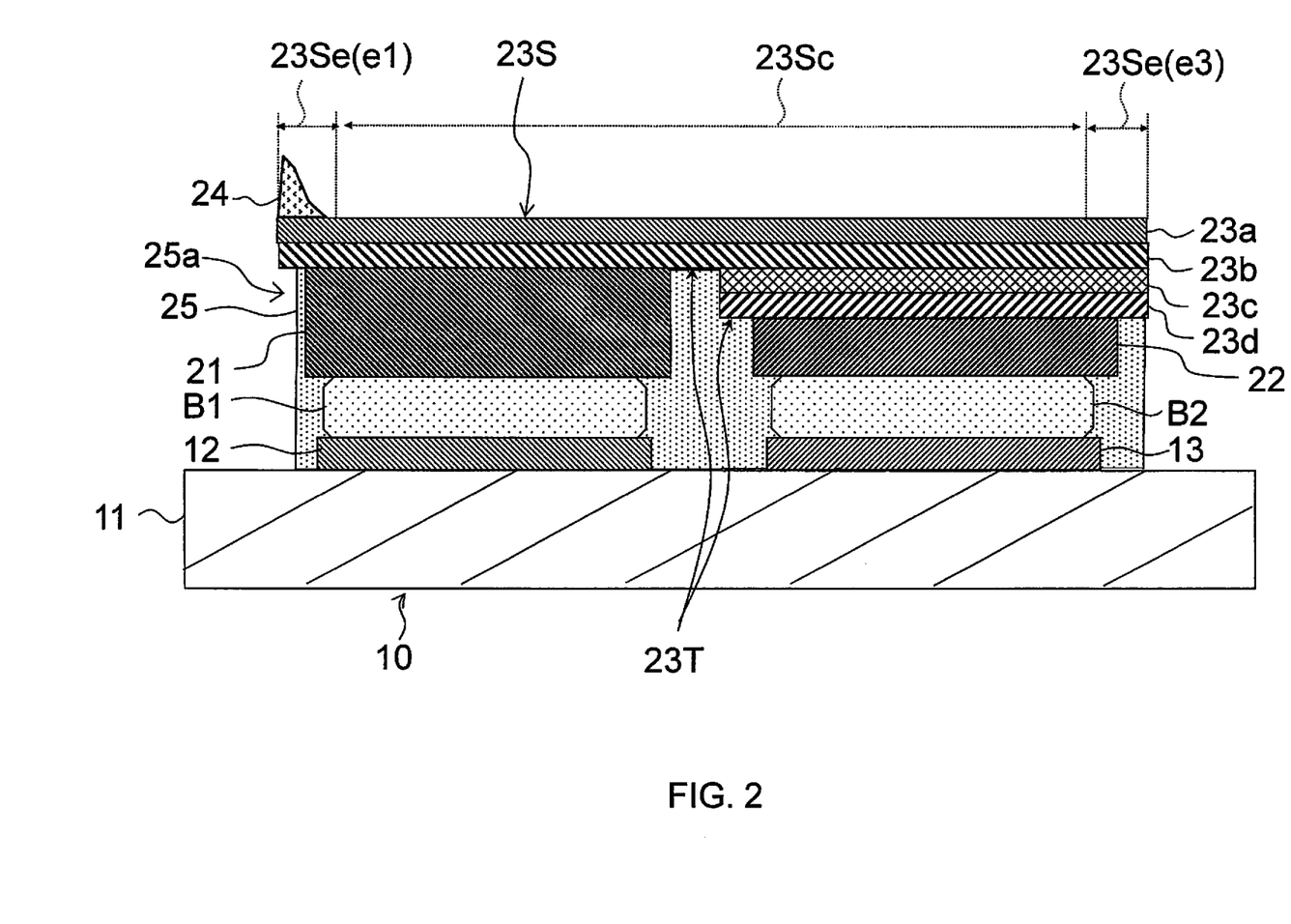
FIG. 2 is a schematic cross section along the A-A line in FIG. 1.

The configuration of the light emitting element 20 and the light emitting device 100 pertaining to an embodiment will be described through reference to the drawings. FIG. 1 is a schematic plan view of the configuration of the light emitting device 100. FIG. 2 is a schematic cross section of the light emitting device 100 along the A-A line in FIG. 1.

The light emitting device 100 comprises at least one substrate 10 and at least one light emitting element 20.

As shown in FIG. 2, the substrate 10 may have at least a substrate main body 11, an n-side wiring electrode 12, and a p-side wiring electrode 13. The substrate main body 11 is made of an electrically insulating material. A glass epoxy, silicone glass, alumina, aluminum nitride, or another such ceramic, or the like can be used as this electrically insulating material. The n-side wiring electrode 12 and the p-side wiring electrode 13 are disposed on at least a main face 11S of the substrate main body 11. The n-side wiring electrode 12 and the p-side wiring electrode 13 are each connected to conductive wiring used for external connections.

As shown in FIGS. 1 and 2, the light emitting element 20 has at least an n-side electrode 21, a p-side electrode 22, a semiconductor layer 23, and a reinforcing portion 24. The n-side electrode 21 and the p-side electrode 22 are an example of the "pair of positive and negative electrodes."

As shown in FIG. 2, the n-side electrode 21 and the p-side electrode 22 are disposed on a lower face 23T side of the semiconductor layer 23. The n-side electrode 21 can be connected to the n-side wiring electrode 12 via a gold bump B1, for example. The p-side electrode 22 can be connected to the p-side wiring electrode 13 via a gold bump B2, for example.

The light emitting element 20 and the substrate 10 may be joined with any material as long as it affords a good electrical and physical connection, or may be joined using an adhesive material of a conductive joining material (such as solder) instead of the bumps B1 and B2. Examples of the material of the n-side electrode 21 and the p-side electrode 22 include gold, nickel, titanium, and aluminum.

The semiconductor layer 23 is disposed on the n-side electrode 21 and the p-side electrode 22. The semiconductor layer 23 of this embodiment mainly has a buffer layer 23a, an n-type semiconductor layer 23b, an active layer 23c, and a p-type semiconductor layer 23d. The buffer layer 23a, the n-type semiconductor layer 23b, and the p-type semiconductor layer 23d can be made from gallium nitride, aluminum gallium nitride, or aluminum nitride, for example, but can also be made from other materials. The active layer 23c can be made from indium gallium nitride or gallium nitride, for example, but can also be made from other materials. The semiconductor layer 23 has an upper face 23S and the lower face 23T. The upper face 23S is the uppermost layer of the semiconductor layer, and is, for example, the surface of the n-type semiconductor layer or the buffer layer 23a. The lower face 23T is the lower face of the n-type semiconductor layer 23b and the p-type semiconductor layer 23d.

The reinforcing portion 24 is disposed on the upper face 23S of the semiconductor layer 23. The reinforcing portion 24 is made from a light-transmissive material. Sapphire, $SiO_2$, alumina, or another such inorganic material, or epoxy, silicone, or another such resin, or the like can be used as the light-transmissive material. This reinforcing portion 24 raises the strength at the ends of the semiconductor layer 23. The reinforcing portion 24 can be formed, for example, in a width of 2 to 20 μm and a height of 2 to 20 μm, and at an angle of about 33 to 55 degrees.

The upper face 23S of the semiconductor layer includes a center part 23Sc and an outer edge part 23Se. The outer edge part 23Se surrounds the center part 23Sc. The outer edge part 23Se is the region within a specific range from the outer edge of the upper face 23S. The outer edge part 23Se of this embodiment includes first to fourth outer edge parts e1 to e4 that are connected sequentially.

In this embodiment, as shown in FIG. 1, the reinforcing portion 24 has a first reinforcing portion 241 and a second reinforcing portion 242. The first reinforcing portion 241 is disposed on the first outer edge part e1. The second reinforcing portion 242 is disposed on the second outer edge part e2. The first reinforcing portion 241 and the second reinforcing portion 242 are connected together. Thus, the majority of the first outer edge part e1 and the second outer edge part e2 is covered by the reinforcing portion 24. The first outer edge part e1 and the second outer edge part e2 are examples of the "covered portion" of the upper face 23S that is covered by the reinforcing portion 24.

Thus, the reinforcing portion 24 can be formed in an L shape that is continuous along the outer edge on two sides of the upper face 23S, for example. That is, the reinforcing portion 24 may not be disposed on the third and fourth outer edge parts e3 and e4. Also, the reinforcing portion 24 may not be disposed on the center part 23Sc. In this embodiment, the third and fourth outer edge parts e3 and e4 and the center part 23Sc of the upper face 23S of the semiconductor layer 23 are exposed from the reinforcing portion 24. This suppresses the reduction in light emission caused by the reinforcing portion 24. The center part 23Sc and the third and fourth outer edge parts e3 and e4 are examples of the "exposed portion" of the upper face 23S that is exposed from the reinforcing portion 24.

The surfaces of the third and fourth outer edge parts e3 and e4 and the center part 23Sc of the upper face 23S of the semiconductor layer 23 are preferably rougher than the surfaces of the first outer edge part e1 and the second outer edge part e2. Specifically, the surface roughness of the third and fourth outer edge parts e3 and e4 and the center part 23Sc is greater than the surface roughness of the outer edge part e1 and the second outer edge part e2. The arithmetic mean roughness Ra or maximum height Ry may be used for comparing surface roughness. This roughness can be obtained by chemically etching the semiconductor layer. This raises the light takeoff efficiency from the light emitting element 20.

Figure 5A:
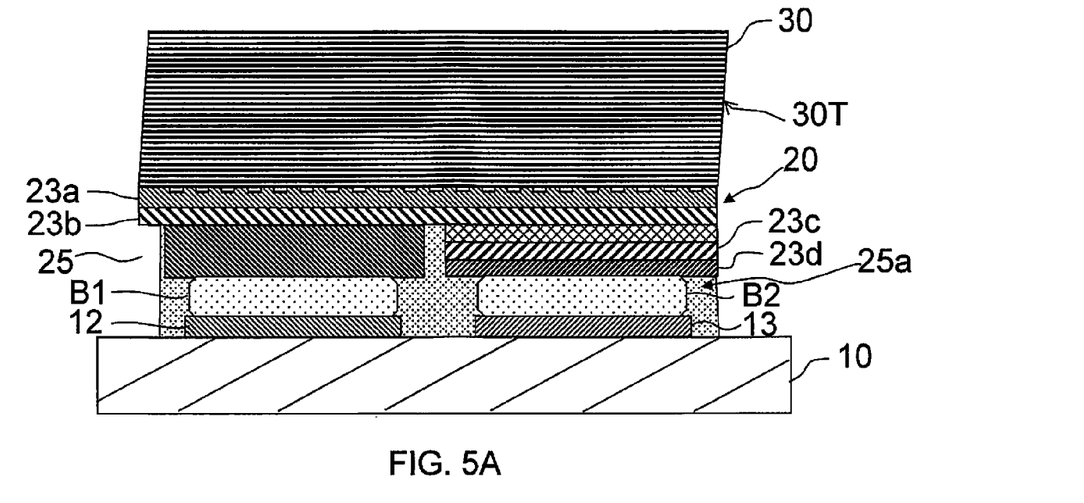
FIG. 5A is a schematic diagram illustrating the method for manufacturing the light emitting element and the light emitting device according to an embodiment.
Figure 5B:
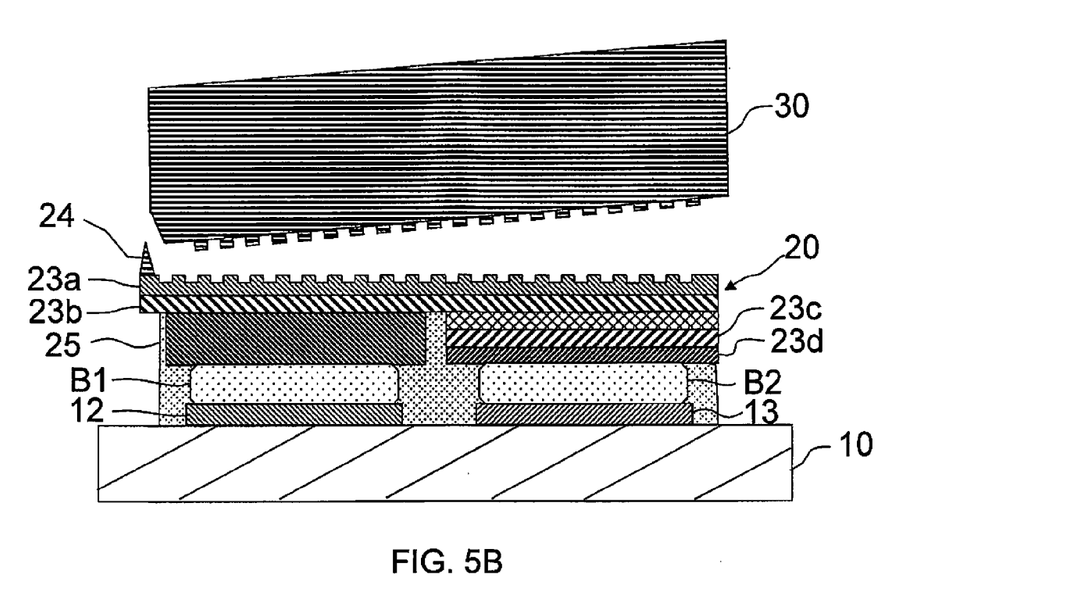
FIG. 5B is a schematic diagram illustrating the method for manufacturing the light emitting element and the light emitting device according to an embodiment.

As shown in FIG. 1, the inner edge 24a of the reinforcing portion 24 may be formed in wavy line pattern (that is, zigzag) in plan view. Specifically, the inner edge 24a has protrusions in plan view. This is because an end of the sapphire substrate 30 breaks along the shape of the outer edge of convex portions 31 protrusions of the sapphire substrate in the laser liftoff process (see FIG. 5) discussed below. Thus, the reinforcing portion 24 can be simply formed from sapphire by utilizing the convex portions 31, and as a result the inner edge 24a of the reinforcing portion 24 has a bumpy (wavy) pattern that corresponds to the layout of the convex portions 31.

On the other hand, the inner edge 24a of the reinforcing portion 24 can be easily formed in a straight line by forming the reinforcing portion 24 by some method other than laser liftoff, such as a coating or printing method.

As shown in FIG. 2, the reinforcing portion 24 may be formed in a shape that tapers upward from the upper face 23S. In other words, the outer edge side of the reinforcing portion 24 may be higher than the inner edge side. The reason for this is that cracks form diagonally from the outer edges of the convex portions 31 toward an inclined side face 30T (see FIG. 5A) in the laser liftoff process of the sapphire substrate 30 (discussed below). Thus forming the reinforcing portion so that its thickness increases at the ends of the semiconductor layer raises the strength of the semiconductor layer 23 at its ends, where it is particularly susceptible to damage.

The height of the reinforcing portion 24 may be uniform, however, and a cross section of the reinforcing portion 24 may be elliptical, circular, etc. This reinforcing portion 24 can be formed by some method other than laser liftoff (such as a coating or printing method).

As shown in FIG. 2, in this embodiment an underfill material 25 made of resin preferably fills in the space between the substrate 10 and the semiconductor layer 23. The underfill material 25 is provided to support the semiconductor layer 23. The underfill material 25 is an insulating material, such as one or more materials selected from among silicone resins, epoxy resins, and fluororesins, for example. A silicone resin with high heat resistance and light resistance is particularly favorable. The light extraction efficiency of the light emitting device 100 may be raised by mixing white titanium oxide, silicon oxide, alumina, or another such filler into the underfill material 25. Also, since the strength of the underfill material 25 can be raised by mixing in these fillers, the support strength of the semiconductor layer 23 can be raised in the laser liftoff process of the sapphire substrate 30 (discussed below) or after completion of the light emitting device. As a result, reliability is enhanced during use of the light emitting device 100, and when the substrate 10 is removed.

As shown in FIG. 2, a cut-out 25a may be formed in the underfill material 25. As shown in FIG. 2, the cut-out 25a is preferably formed under the reinforcing portion 24. Specifically, in a plan view of the upper face 23S, the reinforcing portion 24 is preferably formed at a position that overlaps the cut-out 25a. This increases the strength of the unsupported portion of the semiconductor layer 23 at the cut-out 25a (that is, the portion susceptible to damage).

Method for Manufacturing Light Emitting Device 100 and Light Emitting Element 20

Figure 3A:
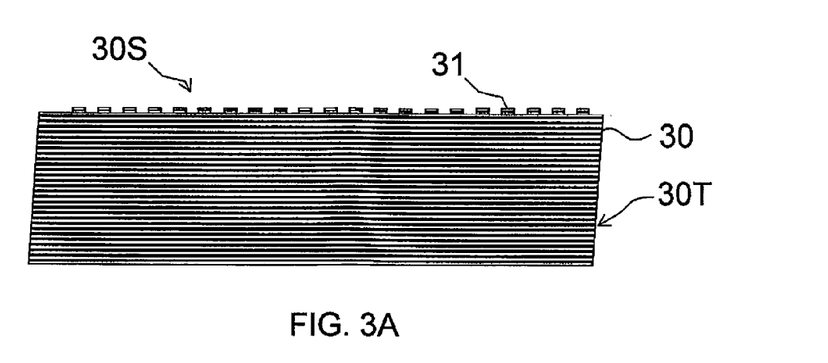
FIG. 3A is a schematic diagram illustrating a method for manufacturing the light emitting element according to an embodiment.
Figure 3B:
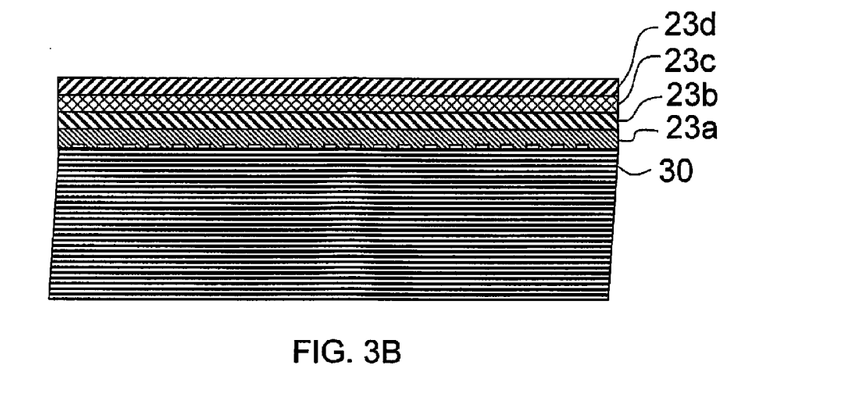
FIG. 3B is a schematic diagram illustrating the method for manufacturing the light emitting element according to an embodiment.
Figure 3C:
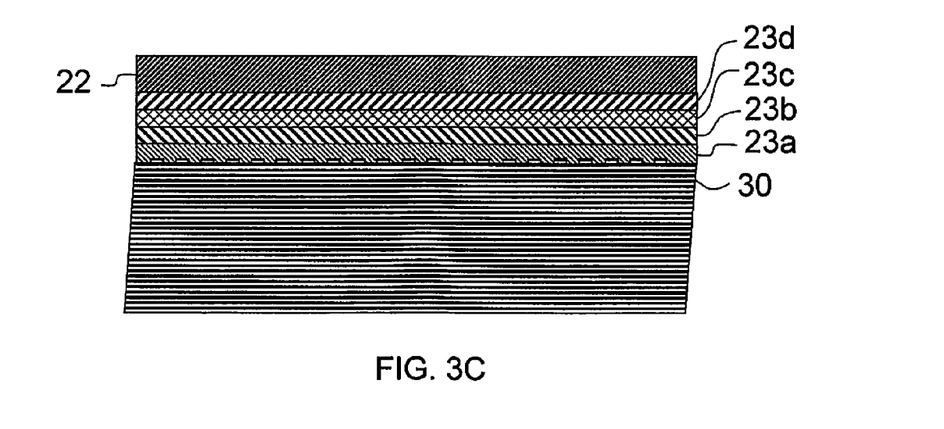
FIG. 3C is a schematic diagram illustrating the method for manufacturing the light emitting element according to an embodiment.
Figure 4A:
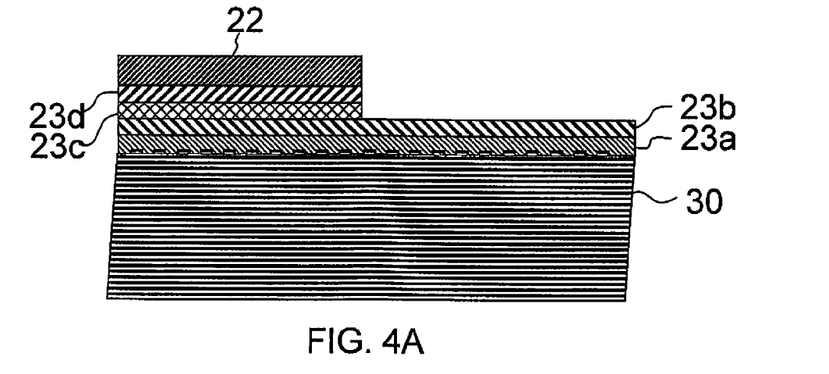
FIG. 4A is a schematic diagram illustrating the method for manufacturing the light emitting element and a light emitting device according to an embodiment.
Figure 4B:
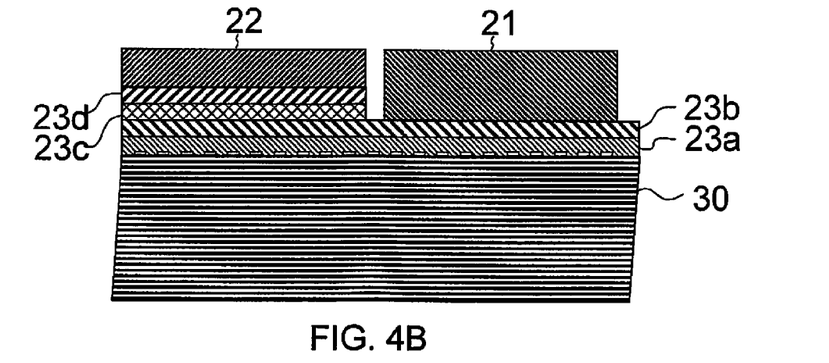
FIG. 4B is a schematic diagram illustrating the method for manufacturing the light emitting element and the light emitting device according to an embodiment.
Figure 4C:
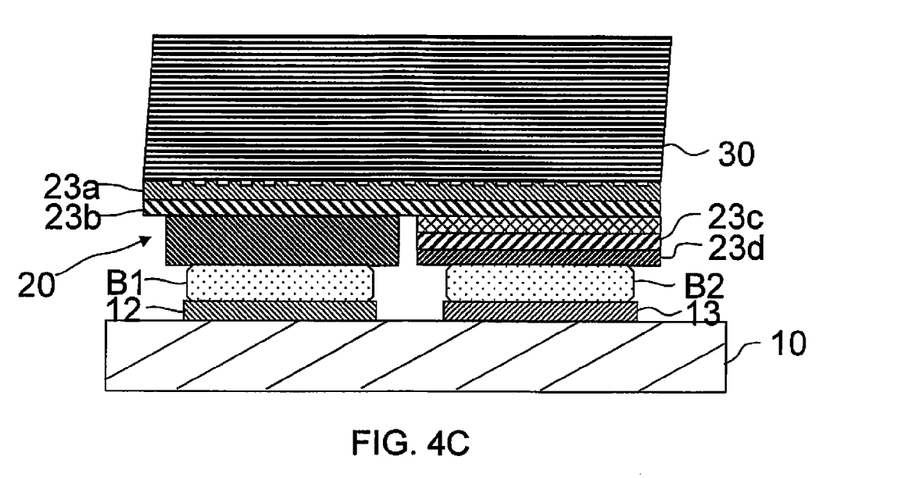
FIG. 4C is a schematic diagram illustrating the method for manufacturing the light emitting element and the light emitting device according to an embodiment.

A method for manufacturing the light emitting device 100 and the light emitting element 20 pertaining to an embodiment will now be described through reference to the drawings. FIGS. 3 to 5 are schematic diagrams illustrating a method for manufacturing the light emitting device 100 and the light emitting element 20.

First, a plurality of light emitting elements 20 with attached sapphire substrates 30 are manufactured. As shown in FIG. 3A, a sapphire substrate 30 is readied as a growth substrate for the semiconductor layer 23. A plurality of convex portions 31 are formed on the main face 30S of the sapphire substrate 30. The convex portions 31 can be in the form of a substantially triangular truncated pyramid (with a height of 3 μm and a pitch of about 1 μm, for example), and these convex portions 31 can be provided in a matrix on the main face 30S of the sapphire substrate 30. Because protrusions are formed on the upper face 23S of the semiconductor layer 23 according to these convex portions 31, the light from the light emitting layer of the semiconductor layer 23 can be extracted off more efficiently from the upper face 23S.

As shown in FIG. 3A, the sapphire substrate 30 is preferably a single-crystal sapphire inclined substrate in which the crystal axis is inclined with respect to the main face 30S. This sapphire substrate 30 has the inclined side face 30T on its side face. This makes it easy to form the reinforcing portion 24 in a shape in which the height is greater at the ends of the semiconductor layer 23.

As shown in FIG. 3B, the buffer layer 23a, the n-type semiconductor layer 23b, the active layer 23c, and the p-type semiconductor layer 23d are then formed in that order on the main face 30S of the sapphire substrate 30 by MOVPE (metalorganic vapor phase epitaxy) method, for example.

As shown in FIG. 3C, the p-side electrode 22 is then formed on the p-type semiconductor layer 23d by vacuum vapor deposition, for example.

As shown in FIG. 4A, the p-side electrode 22, the p-type semiconductor layer 23d, and the active layer 23c are then removed to expose part of the n-type semiconductor layer 23b.

As shown in FIG. 4B, the n-side electrode 21 is then formed on the exposed part of the n-type semiconductor layer 23b by vacuum vapor deposition, for example.

Next, the sapphire substrate 30 (which is roughly 80 to 200 μm thick) and the semiconductor layer 23d is divided up into individual units have a specific size (rectangular pieces measuring from 500 to 2000 μm along oneside in plan view, for example) to obtain light emitting elements 20 with sapphire substrates 30 by breaking and/or scribing. These individual sapphire substrates 30 have the inclined side face 30T.

The resulting light emitting element 20 with the attached the sapphire substrate 30 is then mounted on the substrate 10.

As shown in FIG. 4C, the n-side electrode 21 is connected to the n-side wiring electrode 12 of the substrate 10, and the p-side electrode 22 is connected to the p-side wiring electrode 13 of the substrate 10, via the bumps B1 and B2.

As shown in FIG. 5A, the space between the substrate 10 and the semiconductor layer 23 is then filled with an underfill material, and the portion of the underfill material that sticks out from the side face of the semiconductor layer 23 is blasted away for forming the underfill material 25. Here, since the underfill material is easily blasted away on the inclined side face 30T side of the sapphire substrate 30, the cut-out 25a is formed in the underfill material 25.

As shown in FIG. 5B, the semiconductor layer 23 is then irradiated from the sapphire substrate 30 side with laser light transmitted by the sapphire substrate 30 (such as a KrF excimer laser), which brings about a decomposition reaction in the semiconductor layer 23 and separates the sapphire substrate 30 from the semiconductor layer 23.

Figure 6:
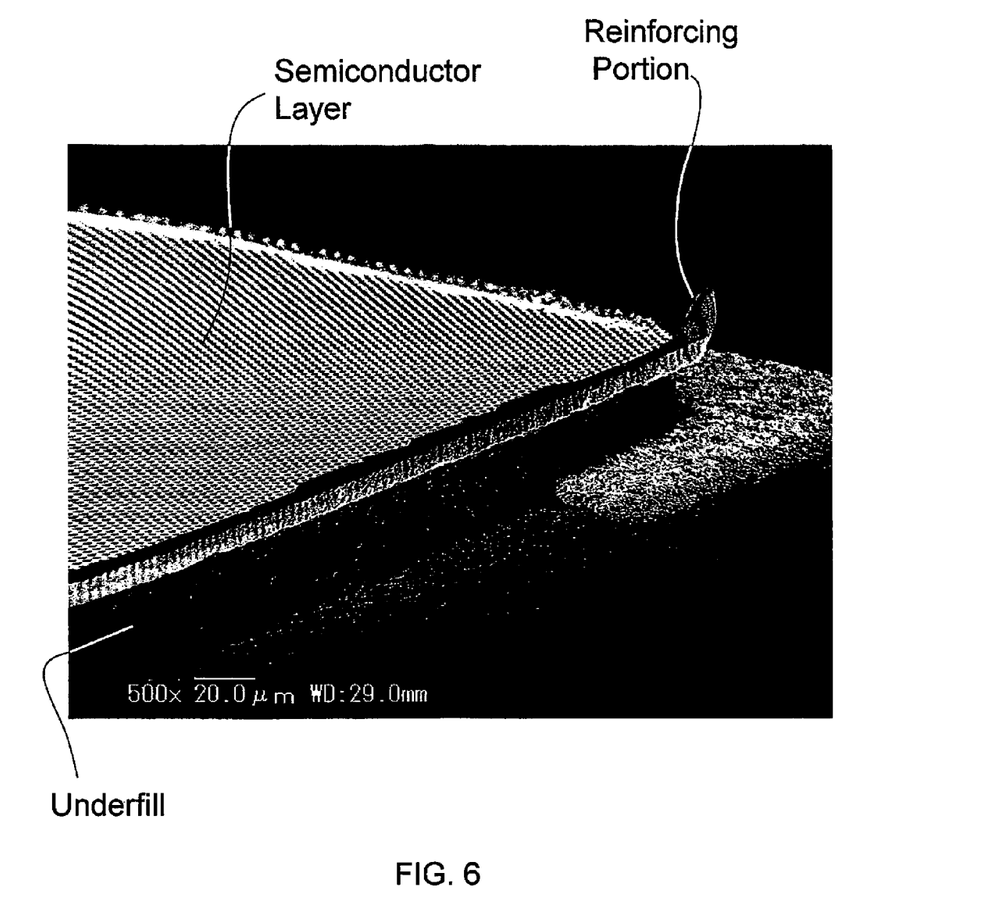
FIG. 6 is an SEM image of a reinforcing portion according to an embodiment.

In this irradiation, since part of the laser light is reflected and refracted at the inclined side face 30T of the sapphire substrate 30, the decomposition reaction of the semiconductor layer 23 does not proceed well at the first outer edge part e1 and the second outer edge part e2 of the upper face 23S of the semiconductor layer 23. As a result, part of the sapphire substrate 30 near the inclined side face 30T ends up still adhering to the upper face 23S, which forms the first reinforcing portion 241 on the first outer edge part e1, and forms the second reinforcing portion 242 on the second outer edge part e2. The sapphire substrate 30 here is split by cracks formed diagonally from the outer edges of the plurality of convex portions 31 toward the inclined side face 30T. FIG. 6 is a SEM image of a reinforcing portion 24 that was actually produced.

As discussed above, the light emitting element 20 in this embodiment comprises a reinforcing portion 24 that is disposed on the outer edge part 23Se of the upper face 23S of the semiconductor layer 23. Therefore, damage to the ends of the light emitting element 20 (and particularly the semiconductor layer 23) can be suppressed.

The reinforcing portion 24 is preferably formed along the outer edge of the upper face 23S. Specifically, the reinforcing portion 24 preferably does not cover the center part 23Sc of the upper face 23S. This suppresses the reduction in emitted light by the reinforcing portion 24.

The underfill material 25 preferably has the cut-out 25a formed on the opposite side of the reinforcing portion 24, with the semiconductor layer 23 in between. This increases the strength of the unsupported portion of the semiconductor layer 23 by the cut-out 25a. Also, compared to when the reinforcing portion 24 is formed all the way around the outer edge part 23Se, there is less reduction of emitted light by the reinforcing portion 24.

The inner edge 24a of the reinforcing portion 24 is preferably formed in a wavy line having protrusions. The reinforcing portion 24 can be formed more simply than when a method other than laser liftoff is used, for example, by forming the reinforcing portion 24 by utilizing the convex portions 31 of the sapphire substrate 30 in the laser liftoff process.

The outer edge side of the reinforcing portion 24 is preferably higher than the inner edge side. This increases the strength of the semiconductor layer 23 at its ends, where it is particularly susceptible to damage. Also, there is less reduction of emitted light by the reinforcing portion 24 than when the reinforcing portion 24 is formed in a uniform height.

Other Embodiments

The embodiment is described above, but the text and drawings that form part of this disclosure should not be construed as limiting this invention.

In the above embodiment, the reinforcing portion 24 is formed only on the first outer edge part e1 and the second outer edge part e2 of the upper face 23S of the semiconductor layer 23, but this is not the only option. The reinforcing portion 24 may also be formed on the third outer edge part e3 or the fourth outer edge part e4. The reinforcing portion 24 is not, however, disposed on the center part 23Sc In the above embodiment, the reinforcing portion 24 is formed by laser liftoff process of the sapphire substrate 30, but this is not the only option. The reinforcing portion 24 can be formed by applying a light-transmissive material by coating, printing, or the like over the outer edge part 23Se of the upper face 23S after the laser liftoff process of the sapphire substrate 30.

In the above embodiment, the semiconductor layer 23 has the buffer layer 23a, the n-type semiconductor layer 23b, the active layer 23c, and the p-type semiconductor layer 23d, but this is not the only option. The semiconductor layer 23 need not have the buffer layer 23a. Also, the light emitting element may be such that the semiconductor layer 23 comprises the p-type semiconductor layer 23d, the active layer 23c, and the n-type semiconductor layer 23b laminated in that order over the sapphire substrate 30, and the p-type semiconductor layer is the upper face.

Figure 7:
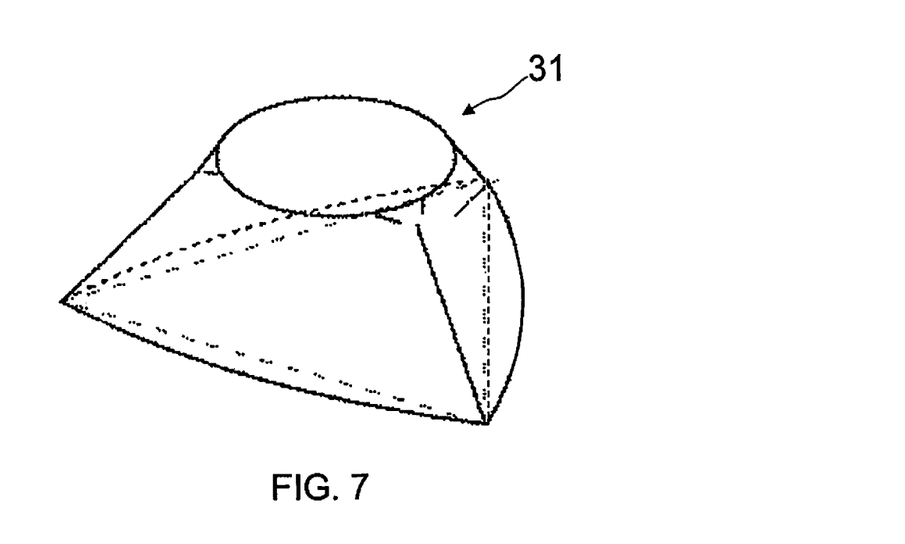
FIG. 7 is a schematic oblique view of the configuration of a convex portion on a sapphire substrate surface according to an embodiment.
Figure 8:
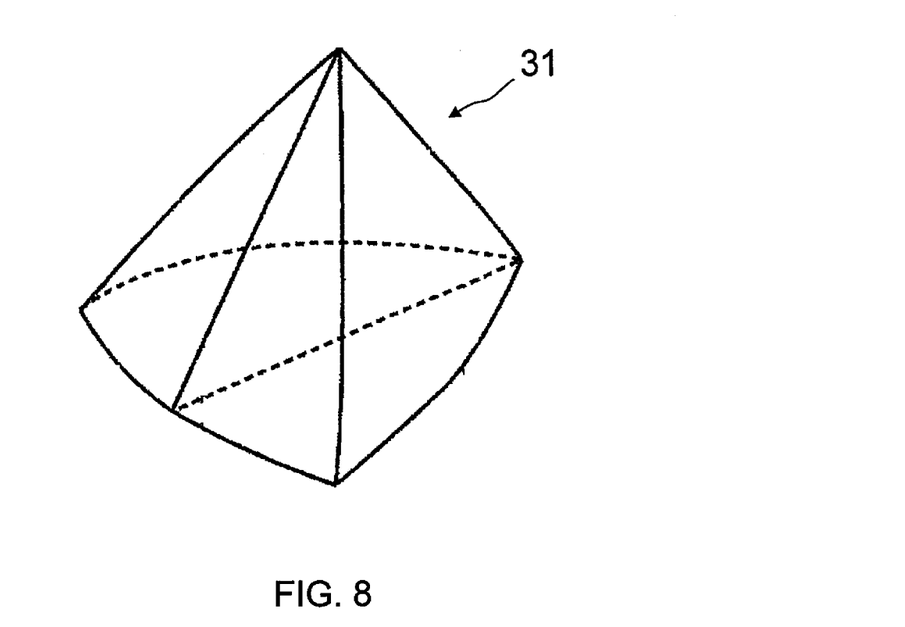
FIG. 8 is a schematic oblique view of the configuration of the convex portions on the sapphire substrate surface according to an embodiment.

As shown in FIG. 7, the convex portions 31 can be in the form of a triangular truncated pyramid in which the sides bulge outward and the top is flat. As shown in FIG. 8, the convex portions 31 can also be in the form of a triangular pyramid in which the sides bulge outward and the top is pointed. Furthermore, the convex portions 31 can be in the form of tetragonal or higher polygonal truncated pyramids, or tetragonal or higher polygonal pyramids. The height of the convex portions 31 can be from 1.0 to 1.7 µm.

Figure 9:
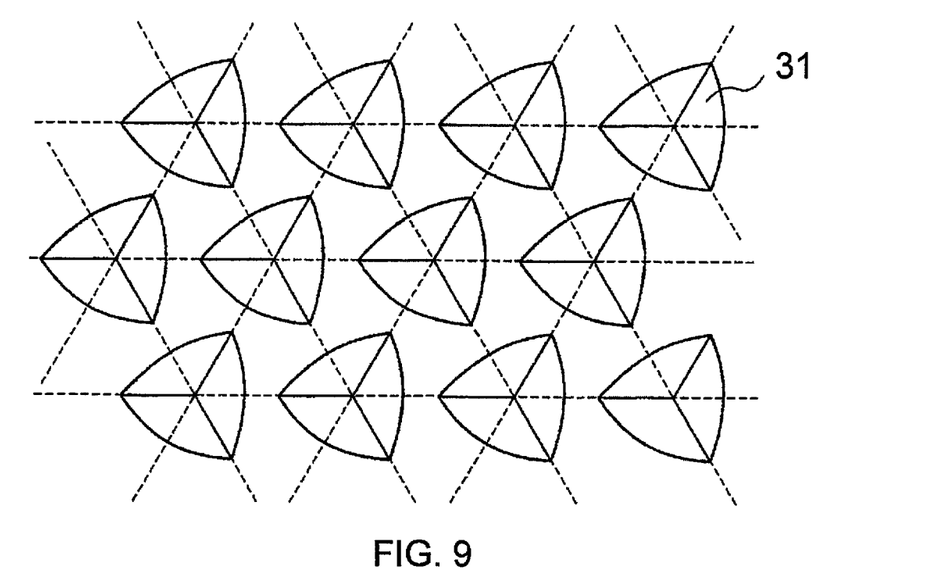
FIG. 9 is a schematic plan view of the layout of a plurality of convex portions on the sapphire substrate surface according to an embodiment.
Figure 10:
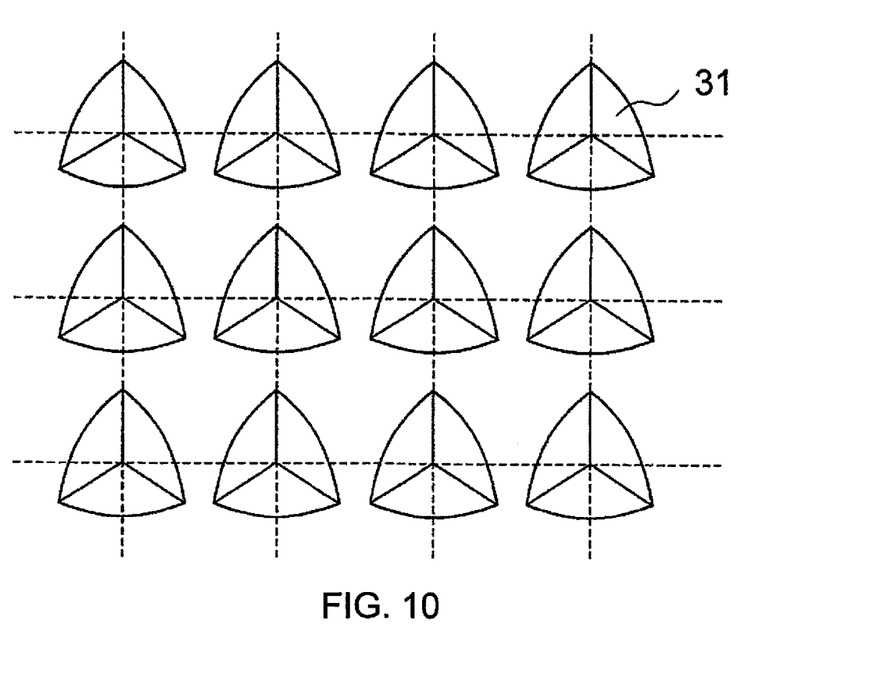
FIG. 10 is a schematic plan view of the layout of a plurality of convex portions on the sapphire substrate surface according to an embodiment.

Also, the triangular lattice layout shown in FIG. 9, the square lattice layout shown in FIG. 10, as well as a parallelogram lattice layout, a rectangular lattice layout, or the like can be employed for the layout of the plurality of convex portions 31. The convex portions 31 need not be laid out in a regular pattern, but are preferably disposed so that they are uniformly separated from each other. The spacing between the apexes of the convex portions 31 is preferably from 2.2 to 3.1 µm, and more preferably from 2.8 to 3.1 µm. Thus setting the spacing of the apexes increases the crystallinity of the semiconductor layer 23 grown on the sapphire substrate 30, and raises the light extraction efficiency of the light emitting device 100.

In the above embodiment, the substrate 10 comprises the substrate main body 11, the n-side wiring electrode 12, and the p-side wiring electrode 13, but this is not the only option. As long as the light emitting element 20 can be mounted, the substrate 10 need not have the substrate main body 11, and may be a lead frame having only the n-side wiring electrode 12 and the p-side wiring electrode 13.

Also, the light emitting device of the present invention may have a sealing member for sealing the light emitting element 20, the substrate 10, etc. This improves the reliability of the light emitting device. A resin material with high translucency, such as silicone or epoxy, can be used as the sealing member.

What is claimed is:

1. A light emitting element disposed on a substrate comprising:
   a semiconductor layer;
   a pair of positive and negative electrodes disposed on a lower face side of the semiconductor layer, the pair of electrodes connected to the substrate; and
   a reinforcing portion disposed on an outer edge part of an upper face of the semiconductor layer, the reinforcing portion made from a light-transmissive material;
   the upper face including an exposed portion exposed from the reinforcing portion, and
   the reinforcing portion is made of sapphire.

2. The light emitting element according to claim 1, wherein the reinforcing portion is formed along an outer edge of the upper face.

3. The light emitting element according to claim 2, further comprising:
   a resin portion arranged to fill a space between the substrate and the semiconductor layer, wherein
   the resin portion has a cut-out below the reinforcing portion.

4. The light emitting element according to claim 3, wherein an inner edge of the reinforcing portion has protrusions in plan view.

5. The light emitting element according to claim 4, wherein the reinforcing portion is higher on an outer edge side than on an inner edge side.

6. The light emitting element according to claim 5, wherein the exposed portion is rougher than a covered portion which is covered by the reinforcing portion.

7. The light emitting element according to claim 1 further comprising:
   a resin portion arranged to fill a space between the substrate and the semiconductor layer, wherein
   the resin portion has a cut-out below the reinforcing portion.

8. The light emitting element according to claim 7, wherein an inner edge of the reinforcing portion has protrusions in plan view.

9. The light emitting element according to claim 8, wherein the reinforcing portion is higher on an outer edge side than on an inner edge side.

10. The light emitting element according to claim 9, wherein
    the exposed portion is rougher than a covered portion which is covered by the reinforcing portion.

11. The light emitting element according to claim 1, wherein an inner edge of the reinforcing portion has protrusions in plan view.

12. The light emitting element according to claim 11, wherein
    the reinforcing portion is higher on an outer edge side than on an inner edge side.

13. The light emitting element according to claim 12, wherein
    the exposed portion is rougher than a covered portion which is covered by the reinforcing portion.

14. The light emitting element according to claim 1, wherein
    the reinforcing portion is higher on an outer edge side than on an inner edge side.

15. The light emitting element according to claim 14, wherein
    the exposed portion is rougher than a covered portion which is covered by the reinforcing portion.

16. The light emitting element according to claim 1, wherein
    the exposed portion is rougher than a covered portion which is covered by the reinforcing portion.

17. A light emitting device, comprising:
    the light emitting element according to claim 1; and
    the substrate on which the light emitting element is mounted.

* * * * *